US010916327B1

(12) United States Patent
He

(10) Patent No.: US 10,916,327 B1
(45) Date of Patent: Feb. 9, 2021

(54) APPARATUSES AND METHODS FOR FUSE LATCH AND MATCH CIRCUITS

(71) Applicant: MICRON TECHNOLOGY, INC., Boise, ID (US)

(72) Inventor: Yuan He, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/531,492

(22) Filed: Aug. 5, 2019

(51) Int. Cl.
G11C 29/50 (2006.01)
G11C 29/44 (2006.01)
G11C 17/16 (2006.01)
G11C 29/00 (2006.01)

(52) U.S. Cl.
CPC .......... G11C 29/76 (2013.01); G11C 17/16 (2013.01); G11C 29/4401 (2013.01); G11C 29/50 (2013.01); G11C 29/785 (2013.01); G11C 29/802 (2013.01); G11C 2029/4402 (2013.01)

(58) Field of Classification Search
CPC .............. G11C 29/785; G11C 17/16
USPC ....................................... 365/225.7
See application file for complete search history.

(56) References Cited

U.S. PATENT DOCUMENTS

| | | | | |
|---|---|---|---|---|
| 6,307,767 B1 * | 10/2001 | Fuh | ........... | G11C 15/04 365/189.05 |
| 7,388,420 B2 * | 6/2008 | Diorio | ........... | G11C 7/20 327/208 |
| 9,412,473 B2 * | 8/2016 | Chung | ........... | G11C 29/702 |
| 10,388,396 B2 * | 8/2019 | Best | ........... | G11C 11/401 |

* cited by examiner

*Primary Examiner* — Son L Mai
(74) *Attorney, Agent, or Firm* — Dorsey & Whitney LLP

(57) ABSTRACT

Embodiments of the disclosure are drawn to apparatuses and methods for fuse latch and match circuits. A memory may include a number of fuse registers, each of which is associated with a line of redundant memory cells. An address may be stored in fuse latches of the fuse register. A dynamic logic circuit may activate one of the fuse registers and a match logic circuit may compare the address stored in the activated fuse register to an address received as part of an access operation to determine if the redundant memory cells should be accessed. The fuse latches may be floated during a power up operation. The dynamic logic circuit may control a timing of the activation and comparison operation.

20 Claims, 9 Drawing Sheets

APPARATUSES AND METHODS FOR FUSE LATCH AND MATCH CIRCUITS

BACKGROUND

This disclosure relates generally to semiconductor devices, and more specifically to semiconductor memory devices. In particular, the disclosure relates to memory, such as dynamic random access memory (DRAM). Information may be stored in memory cells, which may be organized into rows (word lines) and columns (bit lines). At various points in manufacturing and use of a memory device, one or more memory cells may fail (e.g., become unable to store information, be inaccessible by the memory device, etc.) and may need to be repaired.

The memory device may perform repair operations on a row-by-row basis and/or column-by-column basis. For example, during a column repair operation a column containing a failed memory cell (which may be referred to as a defective column, a bad column, or a faulty column) may be identified. The memory device may contain additional column of memory (which may also be referred to as redundant column) which may be used in repair operations. During a repair operation, a column address associated with the defective column may be redirected, such that the column address points to a redundant column instead.

DETAILED DESCRIPTION

Figure 1:
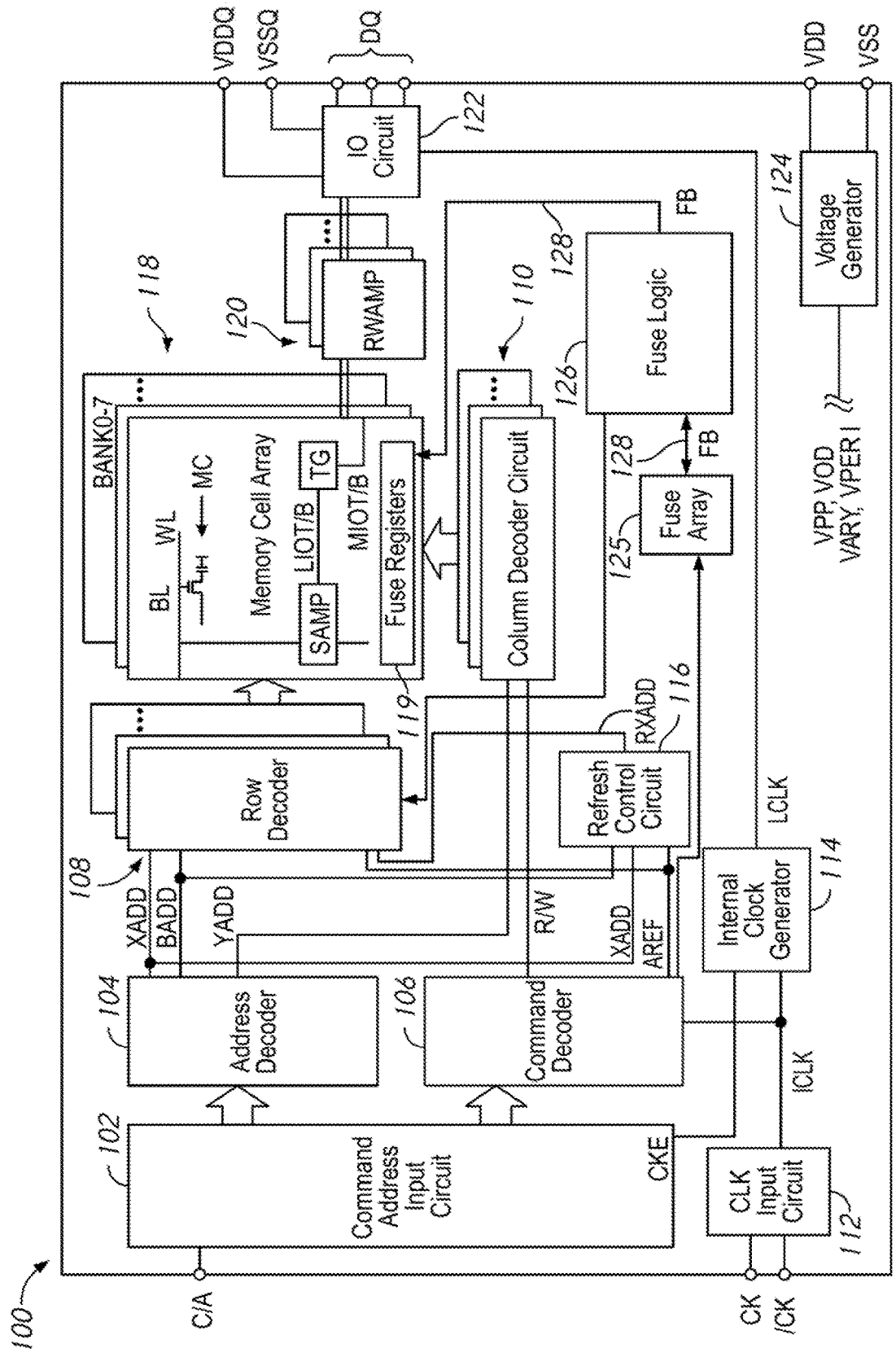
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Semiconductor memory devices may store information in a plurality of memory cells. The information may be stored as a binary code, and each memory cell may store a single bit of information as either a logical high (e.g., a "1") or a logical low (e.g., a "0"). The memory cells may be organized at the intersection of word lines (rows) and bit lines (columns). The memory may further be organized into one or more memory banks, each of which may include a plurality of rows and columns. During operations, the memory device may receive a command and an address which specifies one or more rows and one or more columns and then execute the command on the memory cells at the intersection of the specified rows and columns (and/or along an entire row/column). As used herein, the term memory line may be used to refer to either a row or column of the memory. It should be noted that the memory lines describe an organizational structure and do not necessarily have to be linear in shape. Memory lines of the present disclosure may for example be curved, discontinuous, may include one or more angles etc. Embodiments of the present disclosure described with respect to a particular type of memory line (e.g., a column) may be adapted for use with the other type of memory line (e.g., a row). While not shown or discussed herein, it should be understood that in order to adapt one of the described circuits from use in, for example, column repair operations to row repair operations, minor changes to the layout and function of the apparatuses and methods described herein may be required.

Certain memory cells may be defective, and memory lines containing one or more defective memory cells may generally be referred to as defective lines (or bad lines or faulty lines). The defective lines may be incapable of storing information and/or may become otherwise inaccessible to the memory device. The memory device may carry out one or more types of repair operation to resolve the defective lines, which may be done on a line-by-line basis (e.g., a row-by-row basis and/or a column-by-column basis).

Memory banks may generally include a number of additional memory lines, which may generally be referred to as redundant lines (e.g., redundant rows and/or redundant columns). During a repair operation, a memory line address (e.g., a row and/or column address) associated with a defective line may be redirected so that it is associated with one of the redundant lines instead. For example, each redundant line may be associated with a fuse register (including a number of fuse latches). During a repair operation, a memory line address which indicates a defective line may be stored in the fuse register. When a subsequent access operation occurs on the stored memory line address, fuse match circuits may compare the accessed address to the address stored in the fuse register and if there is a match, access the redundant line associated with the fuse register instead of the defective line originally associated with that memory line address. Since there may be a relatively large number of fuse registers, it may be desirable to reduce the 'footprint' and/or power consumption of the fuse registers and/or the circuitry needed to operate them (e.g., the fuse match circuits).

The present disclosure is generally directed to fuse latch and match circuits. Each of the fuse registers may include a number of fuse latches, which each store a bit of the stored memory line address. As described in more detail herein, the fuse latches of the present disclosure may include a smaller number of components (e.g., transistors) and/or may involve weaker transistors (which may take up less space and power) than traditional fuse latches. For example, the fuse latches may include a pair of cross-coupled inverters, each of which may include a high and low power supply terminal. One of the inverters may be a weak inverter and/or may have a high power supply which is 'floated' during a power up of the memory. Floating the power supply terminal may reduce or eliminate the need for a separate switch to reset the state of the fuse latch, and may prevent the fuse latch from latching a false value during power up.

The match circuits of the present disclosure may activate a fuse register, and then compare the address stored in the activated fuse register to a memory line address incoming as part of an access command, and activated the redundant line associated with the fuse register based on that comparison. For example, the fuse registers may be column fuse registers which store repaired column addresses. There may be a number of fuse registers each associated with segment of the memory. A dynamic logic circuit may receive a memory line address (e.g., a row address or a column address), identify a segment of the memory based on the memory line address, and activate one of the fuse registers associated with that segment. Dynamic logic may be used where the signal lines providing the bits of the activated register are pre-charged to a first level, and only changed if the bit in the coupled fuse latch is in a particular state. The dynamic logic circuit may also be used to control a timing of the comparison operation performed by the match circuit.

FIG. 1 is a block diagram of a semiconductor device according to at least one embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL (e.g., rows), a plurality of bit lines BL and /BL (e.g., columns or digit lines), and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The device also includes a fuse array 125, which contains a plurality of non-volatile storage elements which may store information about addresses in the memory array 118. The fuse array 125 includes non-volatile storage elements, such as fuses or anti-fuses. Each fuse may be in a first state where it is conductive, and may be 'blown' to make the fuse insulating instead. Each anti-fuse may be in a first state which is non-conductive, until it is blown to make the anti-fuse conductive instead. Each fuse/anti-fuse may permanently change when it is blown. Each fuse/anti-fuse may be considered to be a bit, which is in one state before it is blown, and permanently in a second state after it's blown. For example, a fuse may represent a logical low before it is blown and a logical high after it is blown, while an anti-fuse may represent a logical high before it is blown and a logical low after it is blown. It should be understood that discussions of fuses as used herein may generally refer to either fuses or anti-fuses and that embodiments may use fuses, anti-fuses, or a combination thereof in the fuse array 125.

Specific groups of fuses/anti-fuses may be represented by a fuse bank address FBA, which may specify the physical location of each of the fuses/anti-fuses in the group within the fuse array 125. The group of fuses/anti-fuses associated with a particular FBA may in turn be used to encode an address associated with one or more memory cells of the memory array 118. For example, the state of a group of fuses/anti-fuses may represent a memory line address (e.g., either a row address XADD or a column address YADD). The address information in the fuse array 125 may be 'scanned' out along a fuse bus (FB and xFB) 128 to fuse registers 119. Each fuse register may be associated with a particular memory line of the memory array 118. In some embodiments, only the redundant memory lines of the memory array 118 (e.g., the rows/columns designated for use in repair operations) may be associated with one of the fuse registers 119. The address stored in a given group of fuses/anti-fuses (e.g., a group specified by an FBA) may be scanned out from the fuse array 125 along the fuse bus 128, and may be latched by a particular fuse register 119. The fuse logic circuit 126 may determine which address broadcast along the fuse bus FB 128 is latched in which fuse register 119. In this manner, an address stored in the fuse array 125 may be associated with a particular memory line of the memory array 118. When an incoming row/column address XADD or YADD matches the address stored in the fuse register 119, it may then direct access commands to the memory line associated with that fuse register 119.

The fuse registers 119 may each contain a number of fuse latches, each of which stores a bit of the stored memory line address. Since row addresses XADD and column addresses YADD may be different lengths, fuse registers 119 associated with redundant rows may have a different number of fuse latches than fuse registers 119 associated with redundant columns. Each of the fuse registers may be coupled to a fuse match circuit, which compares the incoming memory line address as part of an access operation to the address stored in the fuse register 119 to determine if there is a match. If there is a match, the redundant memory line associated with the fuse register 119 may be activated.

Some components of the match circuits, as well as other control logic of the fuse registers 119 may be shared between multiple fuse registers 119. For example, in some embodiments, match circuits may be shared by a number of different fuse registers 119. In some embodiments a dynamic logic circuit may manage which of the fuse registers 119 coupled to a match circuit is active to provide the address stored in that fuse registers 119 for a comparison operation to determine if an accessed memory line address matches the stored address. In some embodiments, the dynamic logic circuit may also manage timing of the comparison operation.

The structure and operation of the fuse registers 19 as well as match circuits and other control circuitry will be discussed in more detail in FIGS. 3-8.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a row activation command ACT. When the row activation command ACT is received, a bank address BADD and a row address XADD are timely supplied with the row activation command ACT.

The device 100 may receive an access command which is a read command. When a read command is received, a bank address BADD and a column address YADD are timely supplied with the read command, read data is read from memory cells in the memory array 118 corresponding to the row address XADD and column address YADD. For example, the row decoder may access the wordline associated with the row latch 119 which has an address which matches XADD. The read command is received by the command decoder 106, which provides internal commands so that read data from the memory array 118 is provided to the read/write amplifiers 120. The row decoder 108 may match the address XADD to an address stored in a row latch 119, and then may access the physical row associated with that row latch 119. The read data is output to outside from the data terminals DQ via the input/output circuit 122.

The device 100 may receive an access command which is a write command. When the write command is received, a bank address BADD and a column address YADD are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. The row decoder 108 may match the address XADD to an address stored in a row latch 119, and then access the physical row associated with that row latch 119. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out an auto-refresh operation. The refresh signal AREF may be a pulse signal which is activated when the command decoder 106 receives a signal which indicates an auto-refresh command. In some embodiments, the auto-refresh command may be externally issued to the memory device 100. In some embodiments, the auto-refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to the refresh address control circuit 116. The refresh address control circuit 116 supplies a refresh row address RXADD to the row decoder 108, which may refresh a wordline WL indicated by the refresh row address RXADD. The refresh address control circuit 116 may control a timing of the refresh operation, and may generate and provide the refresh address RXADD. The refresh address control circuit 116 may be controlled to change details of the refreshing address RXADD (e.g., how the refresh address is calculated, the timing of the refresh addresses), or may operate based on internal logic. In some embodiments, the refresh address control circuit 116 may perform both auto-refresh operations, where the wordlines of the memory array 118 are refreshed in a sequence, and targeted refresh operations, where specific wordlines of the memory are targeted for a refresh out of sequence from the auto-refresh operations.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The power supply terminals are also supplied with power supply potentials VDDQ and VSSQ. The power supply potentials VDDQ and VSSQ are supplied to the input/output circuit 122.

Figure 2:
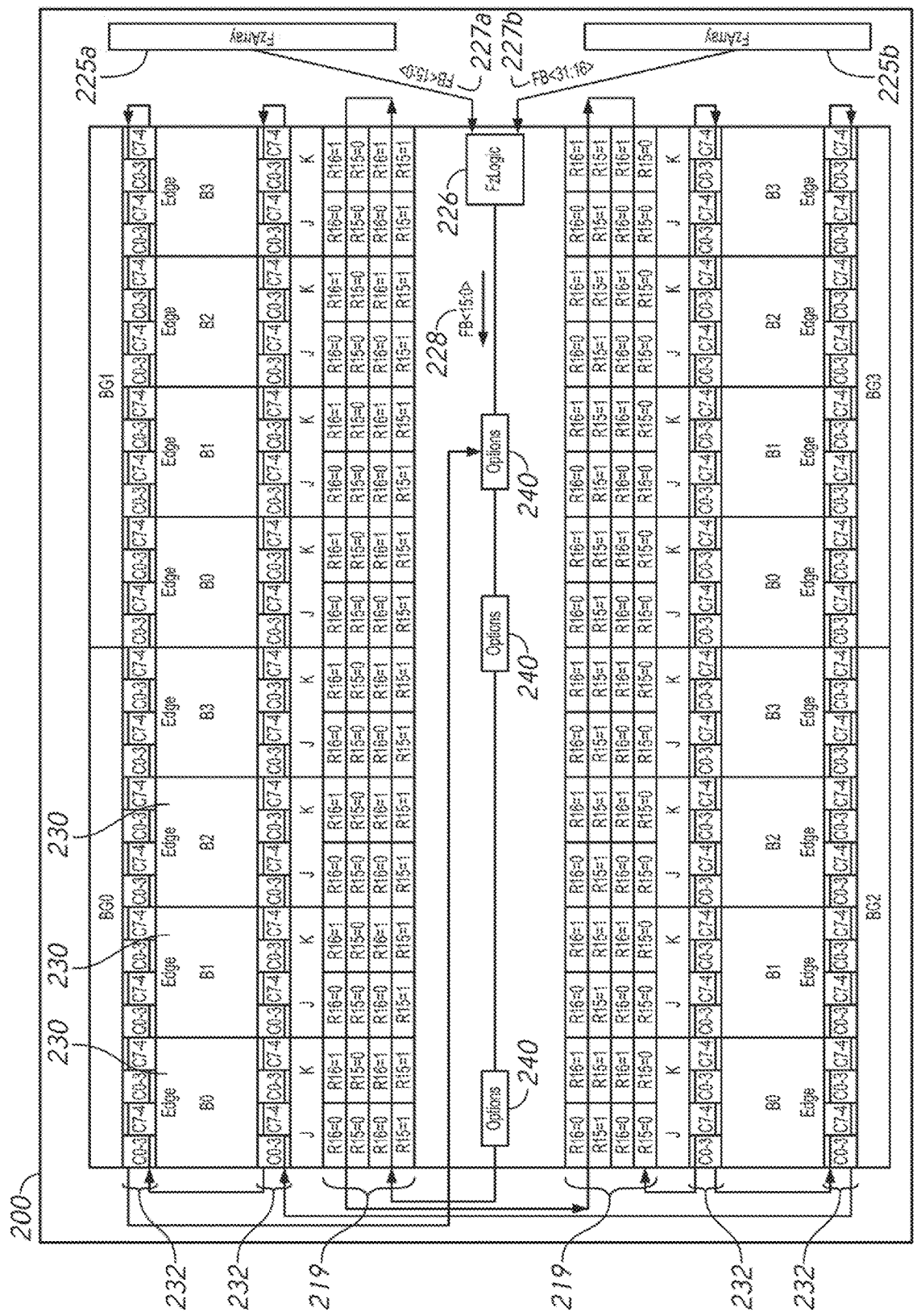
FIG. 2 is a block diagram representing a memory device according to an embodiment of the present disclosure.

FIG. 2 is a block diagram representing a memory device according to an embodiment of the present disclosure. FIG. 2 shows the transmission path of a fuse bus 228 from a pair of fuse arrays 225a and 225b through a memory array 200. In some embodiments, the memory array 200 may be an implementation of the memory array 118 of FIG. 1. However, the memory array 200 includes 16 banks 230 rather than the eight banks previously described with reference to the memory array 118. The 16 banks 230 are organized into four bank groups (BG0-BG3) of four banks 230 each. Each of the banks 230 is associated with a set of fuse latches such as row latches 219 and column latches 232.

Addresses may be scanned out along a fuse bus 228 from the fuse array 225a-b. In the particular embodiment of FIG. 2, there may be a pair of fuse arrays 225a and 225b. Each of the fuse arrays 225a-b may store a number of addresses, encoded in the conductive state of fuses and/or anti-fuses, which may be streamed out along the fuse bus 228 to the fuse registers such as the row latches 219 and column latches 232.

In some embodiments, the fuse array 225a may include anti-fuses, and may be a non-inverting fuse array (since the default value of the anti-fuses is a low logical level) and the fuse array 225b may include fuses and be an inverting fuse array. It may be necessary to 'invert' an address (e.g., swap low logical levels for high logical levels and vice versa) before providing an address based on the inverting fuse array 225b. It should be understood that other methods of organizing addresses in the fuse array(s) may be used in other embodiments. For example, a single fuse array may be used with only fuses, only anti-fuses, or a mix thereof.

During a broadcast operation, the fuse arrays 225a-b may broadcast the row addresses stored in the fuse arrays 225a-b along the fuse bus 228. In the particular embodiment of FIG. 2, during the broadcast operation the fuse logic circuit 226 may receive a portion of the addresses along fuse bus portion 227a from the fuse array 225a, and a portion of the addresses along fuse bus portion 227b from the fuse array 225b. The fuse logic circuit 226 may combine the addresses onto the fuse bus 228 by alternating whether the addresses from the first fuse bus portion 227a or the second fuse bus portion 227b are provided along the fuse bus 228. For clarity, the addresses provided along the fuse bus portion 227a may be referred to as 'even' addresses and the addresses provided along the fuse bus portion 227b may be referred to as 'odd' addresses. It should be understood that even and odd addresses refer to the fuse array 225a-b the address is stored in, and that both fuse bus portions 227a-b may include addresses with numerical values which are both even and odd.

As previously described, the fuse logic circuit 226 may provide data along the fuse bus 228. The fuse logic circuit 226 may alternate between providing the even addresses from fuse bus portion 227a and the odd addresses from fuse bus portion 227b along the fuse bus 228. The fuse logic circuit 226 may also perform one or more operations based on the data of the fuse bus. For example, during a repair operation, the fuse logic 226 may provide a select signal (e.g., such as a write signal) which indicates which fuse register a given address along the fuse bus 228 is latched in.

After leaving the fuse logic circuit 226, the fuse bus 228 may pass data through one or more options circuits 240. The options circuits 240 may include various settings of the memory which may interact with the addresses along the fuse bus 228. For example, the options circuits 240 may include fuse settings, such as the test mode and power supply fuses. Data stored in the fuse arrays 225a-b may be latched and/or read by the options circuits 240, which may then determine one or more properties of the memory based on the options data provided along the fuse bus 228.

After passing through the options circuits 240 the fuse bus 228 may pass through the row latches 229 for all of the memory banks 230 before passing through the column latches 232 for all of the memory banks 230. As well as providing data (including address data) along the fuse bus 228, the fuse logic circuit 226 may also provide one or more select signals along the fuse bus 228. The select signals may be associated with a particular packet of data along the fuse bus, and may determine which circuit along the fuse bus 228 the particular packet of data is associated with. For example, if a row latch select signal is in an active state, it may indicate that the packet of data is to be stored in a row latch 229. In some embodiments, this may overwrite an address already stored in the row latch 229 with the address from the fuse bus 228. Further select signals may be used to specify a particular location of the specific row latch 229 which is intended to store the packet of data (e.g., a bank group select signal, a bank select signal, etc.).

Figure 3:
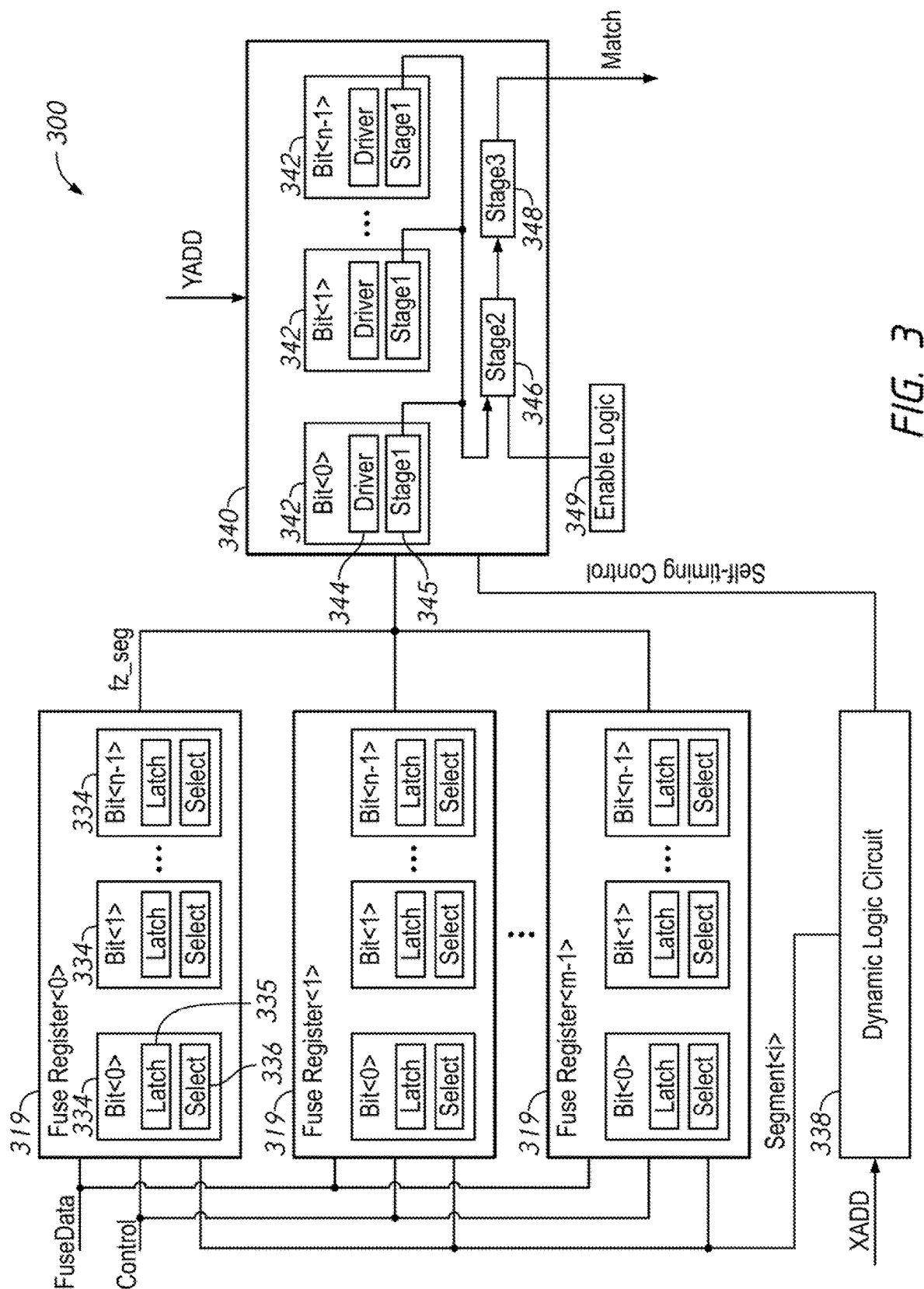
FIG. 3 is a block diagram of a fuse registers and fuse match logic according to an embodiment of the present disclosure.

FIG. 3 is a block diagram of a fuse registers and fuse match logic according to an embodiment of the present disclosure. FIG. 3 shows fuse register control logic 300 which may be included in the device 100 of FIG. 1 and/or 200 of FIG. 2. In particular, the fuse register control logic 300 includes fuse registers 319 which may be included in the fuse registers 119 of FIG. 1 and/or row latches 219 and/or column latches 232 of FIG. 2. The fuse register control logic 300 also includes fuse match logic 340 and dynamic logic circuit 338. The fuse match logic 340 and dynamic logic circuit 338 may be included in the memory array 118 of FIG. 1, the fuse logic 126 of FIG. 1, and/or in one or more locations of the 100.

As shown in the embodiment of FIG. 3, there may be a number of fuse registers 319, here labelled from fuse register<0> to fuse register<m−1>. In the particular embodiment of FIG. 3, the fuse registers 319 may be column registers used to store column addresses as part of a column repair operation. A number of fuse registers 319 may share the dynamic logic circuit 338 and fuse match logic 340 in common. In some embodiments, there may be a single dynamic logic circuit 338 and fuse match logic 340 in each bank of the memory. For example, the memory bank may include m segments, and there may be a fuse register 319 for each segment of the memory array. Thus there are also m different fuse registers 319 (e.g., from 0 to m−1). For example, in some embodiments there may be 16 different segments and 16 different fuse registers 319.

Each of the fuse registers 319 may include a number of fuse latches 334. In the example embodiment of FIG. 3, each fuse latch includes n fuse latches 334, labelled bit<0> to bit<n−1>. In some embodiments, each of the fuse registers 319 may include a number of fuse latches 334 based on the number of bits of the address they are configured to store. For example, in some embodiments, n may be the number of bits of the stored address (e.g., one fuse latch 334 for each bit of the address). In some embodiments, the fuse register 319 may store only a subset of the bits of the stored address. For example, if the column address is 10 bits long (e.g., YADD<0:9>), then each fuse register 319 may include seven fuse latches 334 to store, for example, YADD<3:9>.

Each of the fuse latches 334 may include a latch circuit 335 and a selector circuit 336. The latch circuit 335 stores a bit of information (e.g., a bit of a stored column address). The selector circuit 336 may be used to dynamically provide the information in the latch circuit 335 when the fuse register 319 containing that latch circuit 335 is selected. The latch circuits 335 may have a power terminal coupled in common to a driver circuit (not shown in FIG. 3). During a power up operation of the device (e.g., an initial power up, a reset, etc.) the driver circuit may 'float' the power terminal (e.g., by not providing power to the power terminal during a power up operation). Examples of latch circuits 335 and selector circuits are described in more detail in FIGS. 4-5.

Each of the fuse registers 319 receives a number of signals. For purposes of clarity, each these signals have generally been grouped together and shown as a single data line, labeled as FuseData, Control, and Segment<i> in FIG. 3. Each of these signals may represent one or more different signals, as described in more detail herein, and may represent a multi-bit signal with different bits directed to different of the fuse latches 334 within one or more of the fuse registers 319. For example, the signal line Control may include separate write signals fuseLoad and fuseLoadF which are directed to each of the different fuse registers 319 and provided in common to the fuse latches 334 within that register 319. Accordingly, the signals fuseLoad and fuseLoadF may each be m bits long, one for each of the fuse registers <0> to <m-1>. In another example, the signal FuseData may represent new data (e.g., a new column address) to be written to the fuse registers 319. Accordingly, the signal FuseData may include one bit for each bit which is stored in the fuse register 319 (e.g., FuseData<0:n-1>). The bits of the signal FuseData may be provided to each of the fuse registers 319 in common, with each bit directed to a matching one of the fuse latches 334 in the fuse register 319 (e.g., FuseData<0> to all of the fuse latches 334 Bit<0>, etc.). In this manner, the signals fuseLoad and fuseLoadF may select one of the fuse registers 319 and the signal FuseData may provide data to load into the fuse latches 334 of the selected one of the fuse registers 319. Other signals and other distributions of the signals (e.g., the signals fuseLoad and fuseLoadF may be binary signals provided in common to all fuse registers 319, and a different signal may select the fuse register 319) may be used in other embodiments.

The fuse register control logic 300 also includes a dynamic logic circuit 338. The dynamic logic circuit 338 may control the timing of a comparison operation performed by the fuse register control logic 300 and also may determine which stored address should be used for such a comparison (by activating one of the fuse registers 319). A portion of an example dynamic logic circuit 338 is described in FIG. 7, and the timing of an example dynamic logic circuit 338 is described in FIG. 8.

The dynamic logic circuit 338 may provide a select signal Segment<i>, which may be used to activate one of the fuse registers 319 to provide the address (or portion of the address) stored therein to the fuse match logic 340. The select signal Segment may have a different bit for each of the different fuse registers, (e.g., Segment<0:m-1>). Each bit may be in a low state to indicate that the associated fuse register 319 is inactive or in a high state to indicate that the associated fuse register 319 is active. In some embodiments, the dynamic logic circuit 338 may only provide one of the bits of the signal Segment at a high logic level at a time. In other words, in some embodiments, at most one of the fuse registers 319 may be active at a time. Since the state of the bits of the signal Segment determine whether the fuse register 319 is active or not, in embodiments where only one bit of the signal Segment is active, only one of the fuse registers 319 may be active, while the other fuse registers are inactivated by receiving their respective bits of the signal Segment at a low logical level.

As shown in the example of FIG. 3, the signal Segment<i> represents the signal Segment providing the ith bit at a high level, while the other bits are at a low level (e.g., i may have a value from 0 to m-1). As described in more detail herein, the dynamic logic circuit 338 may provide the signal Segment<i> with a delayed timing relative to one or more of the Self-timing Control signals.

The dynamic logic circuit 338 may determine which of the fuse registers 319 to activate based on one or more addresses associated with an access command. For example, in an embodiment where the fuse registers 319 store column addresses, and there is a fuse register 319 for each segment of the memory, the segments may be identified by a row address XADD. Accordingly, in such an embodiment, the dynamic logic circuit 338 may receive the row address XADD, and provide one of the bits of the select signal Segment at a high level based on the row address XADD. In some embodiments, a value of a portion of the row address (e.g., a subset of the bits of the row address XADD) may be used to determine which bit of the signal Segment is provided at a high logical level. For example, a value of one or more of the bits of the row address XADD may be used to determine the value of 'i' in the signal Segment<i>. It should be noted that while in the example given, the fuse registers 319 store a column address YADD and the row address XADD is used by the dynamic logic circuit 338 to activate a bit of the select signal Segment, in other embodiments any combination of the row and column addresses may be used. For example, in some embodiments the fuse registers 319 may store a column address and the column address may be used by the dynamic logic circuit 338.

Based on the signal Segment<i>, one of the fuse registers 319 may be activated and provide the address stored therein by providing the signals fz_seg. There may be a signal fz_seg for each bit of the address stored in the fuse registers 319 (e.g., fz_seg<0:n-1>). The signal lines which carry the signals fz_seg may be shared in common between the different fuse registers 319.

The address stored in the activated fuse register 319 may be provided to the fuse match logic 340 (e.g., as the signals fz_seg). The fuse match logic 340 may compare the address stored in the fuse register 319 to an incoming address as part of an access operation to determine if there is a match. If there is a match, (e.g., all bits of the stored address match the state of the corresponding bit of the received address), then the fuse match logic 340 may provide a match signal Match. In order to manage the comparison operation, the dynamic logic circuit circuit 338 may provide one or more timing signals Self-timing Control which may be used to manage the timing of operations of the fuse match logic 340. The fuse match logic 340 may include a number of comparator circuits 342, each of which may compare one bit of the stored address to an associated bit of the received address. There may be a comparator circuit 344 for each bit of the stored address in the fuse register 319 (e.g., there may be n different comparator circuits 344). Each of the comparator circuits 344 includes a driver circuit 344 and a first stage comparator 345. The driver circuit 344 may be used, in some embodiments, to pre-charge the signal lines carrying the signals fz_seg. The first stage comparator 345 may compare the bit provided along fz_seg to an associated bit of a received address (in the example of FIG. 3, a column address YADD). An example fuse match logic 340 is described in more detail in FIG. 6.

The dynamic logic circuit 338 may provide timing signals Self-timing Control to the driver circuits 344 in the comparator circuits 342, which may pre-charge all of the different signal lines carrying fz_seg to a voltage representing a particular logical state. For example, all of the signal lines carrying the signal fz_seg may be pre-charged to a high logical level (e.g., pre-charged to a system voltage such as VDD) by the driver circuit 344, and the selector circuit 336 may change the state of the coupled fz_seg signal line based on the state of the bit stored in the latch circuit 335 associated with the selector circuit 336. For example, the bits of the signal fz_seg may be an inverse of the state of the stored bits of the address stored in the fuse latches 334. Accordingly, the signals fz_seg may be pre-charged to a high logical level, and changed to a low logical level (e.g., grounded) if the bit stored in the latch circuit 335 of the associated fuse latch 335 is at a high logical level. The dynamic logic circuit 338 may use signals such as the select signal Segment and the Self-timing Signals to control a timing of the pre-charge operation and the changing of the pre-charged signal lines based on the state of the stored bit.

The first stage comparator 345 may compare the state of the bit stored in a fuse latch 334 of the activated fuse register 319 with an associated bit of received address. The fuse match logic 340 may also include a second stage comparator 346 and third stage comparator 348. The second and the third stage comparators 346-348 may work together to combine the signals from all of the first stage comparators 345 to provide an overall match signal Match which reflects if all of the bits of the address stored in the activated fuse register 319 are the same state as the associated bits of the received memory line address. For example, the overall match signal Match may be at a high logical level if there is match, and at a low level otherwise. In some embodiments, the fuse match logic 340 may be coupled to enable logic 349 which may provide a state signal which indicates if the associated redundant row/column is active or not.

While it is shown as a separate component for clarity of illustration, in some embodiments, the enable logic 349 may be included in each of the fuse registers 319. For example, each of the fuse registers 319 may store an extra bit (e.g., Bit<n>) which is in a first state if the fuse register 319 is enabled (e.g., a high logical level) and a second state if the fuse register 319 is not enabled (e.g., a low logical level). In such embodiments, an Enable signal may be provided by the fuse register 319 activated by the segment signal Segment<i> to the second stage comparator 346.

Figure 4:
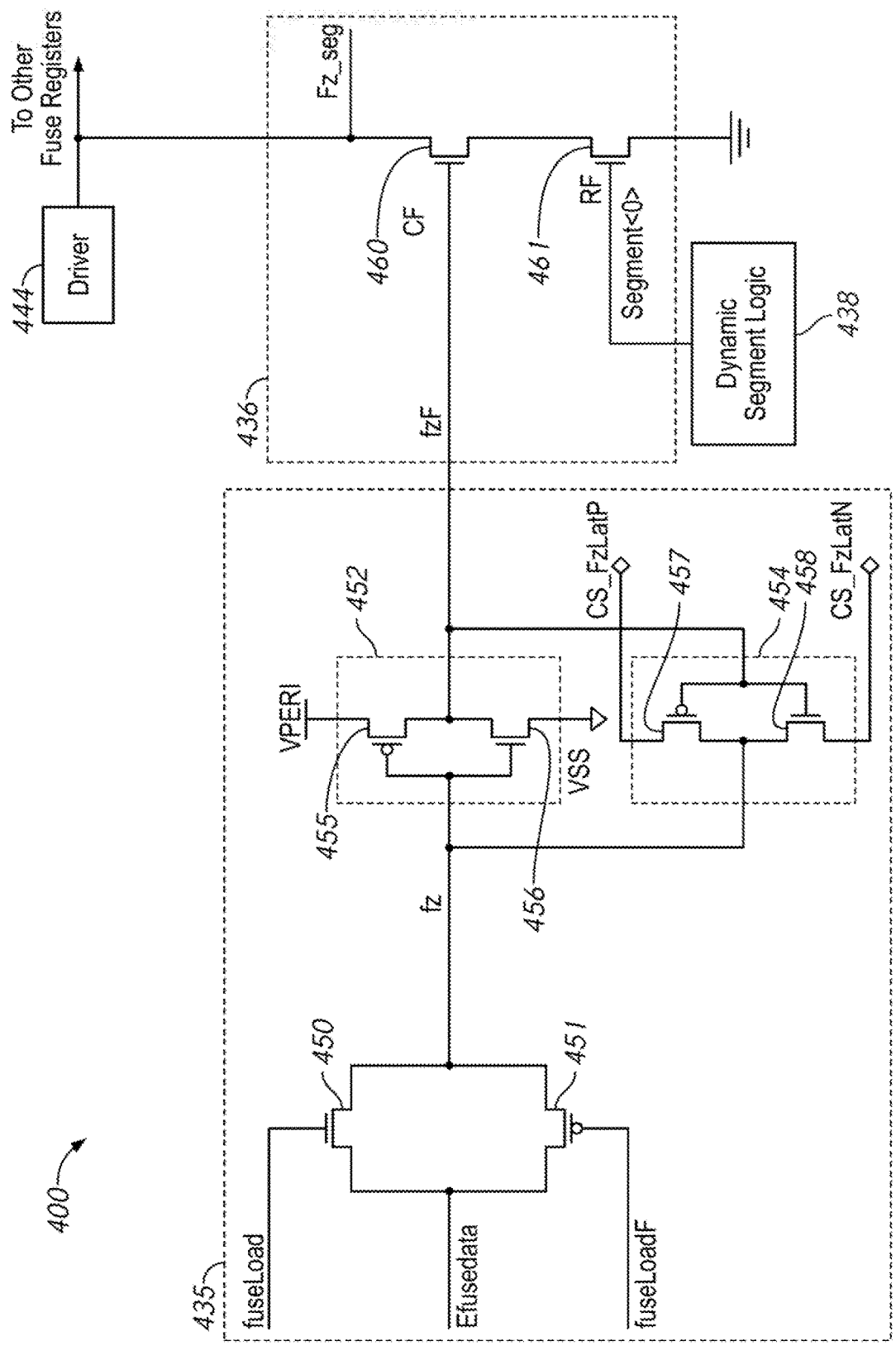
FIG. 4 is a schematic diagram of a fuse latch circuit according to an embodiment of the present disclosure.

FIG. 4 is a schematic diagram of a fuse latch circuit according to an embodiment of the present disclosure. The fuse latch circuit 400 may, in some embodiments, be included in the fuse latch circuit 334 of FIG. 3. The fuse latch circuit 400 includes a latch circuit 435 which may, in some embodiments be included in the latch circuit 335 of FIG. 3 and a selector circuit 436 which may, in some embodiments, be included in the selector circuit 336 of FIG. 3. In FIG. 4, additional components such as a driver 444 (which may be the driver 344 of FIG. 3) and dynamic logic circuit 438 (which may be the dynamic logic circuit 338 of FIG. 3) are also shown.

The latch circuit 435 includes a first inverter circuit 452 and a second inverter circuit 454. Each of the inverter circuits has an input terminal and an output terminal. The output terminal of the first inverter 452 is coupled to an input terminal of the second inverter 454, and the output terminal of second inverter 454 is coupled to the inverter terminal of the first inverter 452. Each inverter circuit 452-454 also has a high power terminal and a low power terminal. The first inverter circuit 452 has a high power terminal coupled to a system voltage (e.g., VPERI) and a low power terminal coupled to a ground voltage (e.g., VSSA). signal fz is coupled into the input of the first inverter 452 (and provided by the output terminal of the second inverter 454) with a state which represents the state of the stored bit. The first inverter 452 provides a signal fzF with a state which is the inverse of the stored bit. The first inverter circuit 452 may act as a driver circuit and may be a stronger inverter circuit than the second inverter circuit 454. In other words, the first inverter circuit 452 may provide the signal fzF on its output terminal with stronger voltage and/or current than the second inverter circuit 454 provides the signal fz on its output terminal.

The latch circuit 435 includes a first transistor 450 and a second transistor 451 which act as switches to load new data into the latch circuit 435. The first and second transistors 450-451 are coupled to signals fuseLoad and fuseLoadF, respectively, (which may be included in the signals Control of FIG. 3) which act as write signals to activate the transistors 450-451. When active, the first and the second transistors 450-451 may act together to write the state of a signal Efusedata (e.g., a bit of the signal FuseData of FIG. 3) onto the node carrying the signal fz (e.g., onto the node coupled to the input terminal of the first inverter 452).

The first transistor 450 has a source coupled to the signal Efusedata, a drain coupled to the signal fz, and a gate coupled to the signal fuseLoad. The first transistor 450 may be a n-type transistor. The second transistor 451 has a source coupled to Efusedata (e.g., in common with the source of the first transistor 450), a drain coupled to the signal fz, and a gate coupled to the signal fuseLoadF. The second transistor 451 may be a p-type transistor. When the signal fuseLoad is a high level and the signal fuseLoadF is at a low level, the first and the second transistors 450-451 may be active, the state of the signal Efusedata may overwrite the state of the signal fz, which may overwrite the state of the bit stored in the latch circuit 435.

The first inverter circuit 452 includes a third transistor 455 and a fourth transistor 456. The third transistor 455 has a source coupled to a system voltage VPERI (which may represent a high logic level), a drain coupled to a node carrying the signal fzF, and a gate coupled to the signal fz. The third transistor 455 may be a p-type transistor. The fourth transistor 456 may include a source coupled to a ground voltage VSS (which may represent a low logic level), a drain coupled to the signal fzF, and a gate coupled to the signal fz. The fourth transistor 456 may be an n-type transistor. Accordingly, when the signal fz is at a high level, the third transistor 455 is inactive while the fourth transistor 456 is active and the signal fzF is coupled to ground (e.g., at a low logical level). Similarly, when the signal fz is at a low level, the third transistor 455 is active while the fourth transistor is inactive 456, and the signal fzF is coupled to VPERI and provided at a high logical level.

The second inverter 454 may generally be similar to the first inverter 452 with a fifth transistor 457 similar to the third transistor 455 and a sixth transistor 458 similar to the fourth transistor 456. In the second inverter 454, the high power terminal (e.g., the source of the fifth transistor 457) is coupled to a signal line FzLatP and the low power terminal (e.g., the source of the sixth transistor 458) is coupled to a signal line CS_FzLatN. The use of these signal lines is discussed in more detail in FIG. 5.

The signal fzF, which has a state which represents an inverse of the bit stored in the latch circuit 435, is provided to a selector circuit 436. The selector circuit 436 includes a seventh transistor 460 and an eighth transistor 461. In preparation for a comparison operation, a driver circuit 444 may pre-charge a signal line carrying the signal Fz_seg to a high level (e.g., to a system voltage such as VDD or VPERI). The driver circuit 444 may be shared among all of the signal lines fz_seg for a given bit. In other words, each driver circuit 444 may be coupled in common to a given bit for each of the fuse registers (e.g., registers 319 of FIG. 3).

The seventh transistor 460 has a drain coupled to the signal line Fz_seg, and a source coupled to a drain of the eighth transistor 461. The source of the eighth transistor 461 is coupled to a ground voltage (e.g., VSS). The gate of the seventh transistor 460 is coupled to the signal fzF and the gate of the eighth transistor 461 is coupled to one of the bits of the signal Segment provided by the dynamic logic circuit 438. Both the seventh transistor 460 and the eighth transistor 461 may be n-type transistors.

After the signal Fz_seg has been pre-charged to a high level, the dynamic logic of the selector circuit 436 may change the state of the signal Fz_seg to a low level if both the signal fzF and the select signal Segment are both at a high level. The signal fzF being at a high level may activate the seventh transistor 460 and the select signal Segment being at a high level may activate the eighth transistor 461. When both the seventh and eighth transistor are active, the signal line carrying Fz_seg may be coupled to ground. When the signal fzF is at a low level, the signal Fz_seg may remain at a high level. Accordingly, the signal Fz_seg may have a state which is an inverse of the signal fzF, and therefore the signal Fz_seg may have a state which matches the state of the bit stored in the latch circuit 435.

Figure 5:
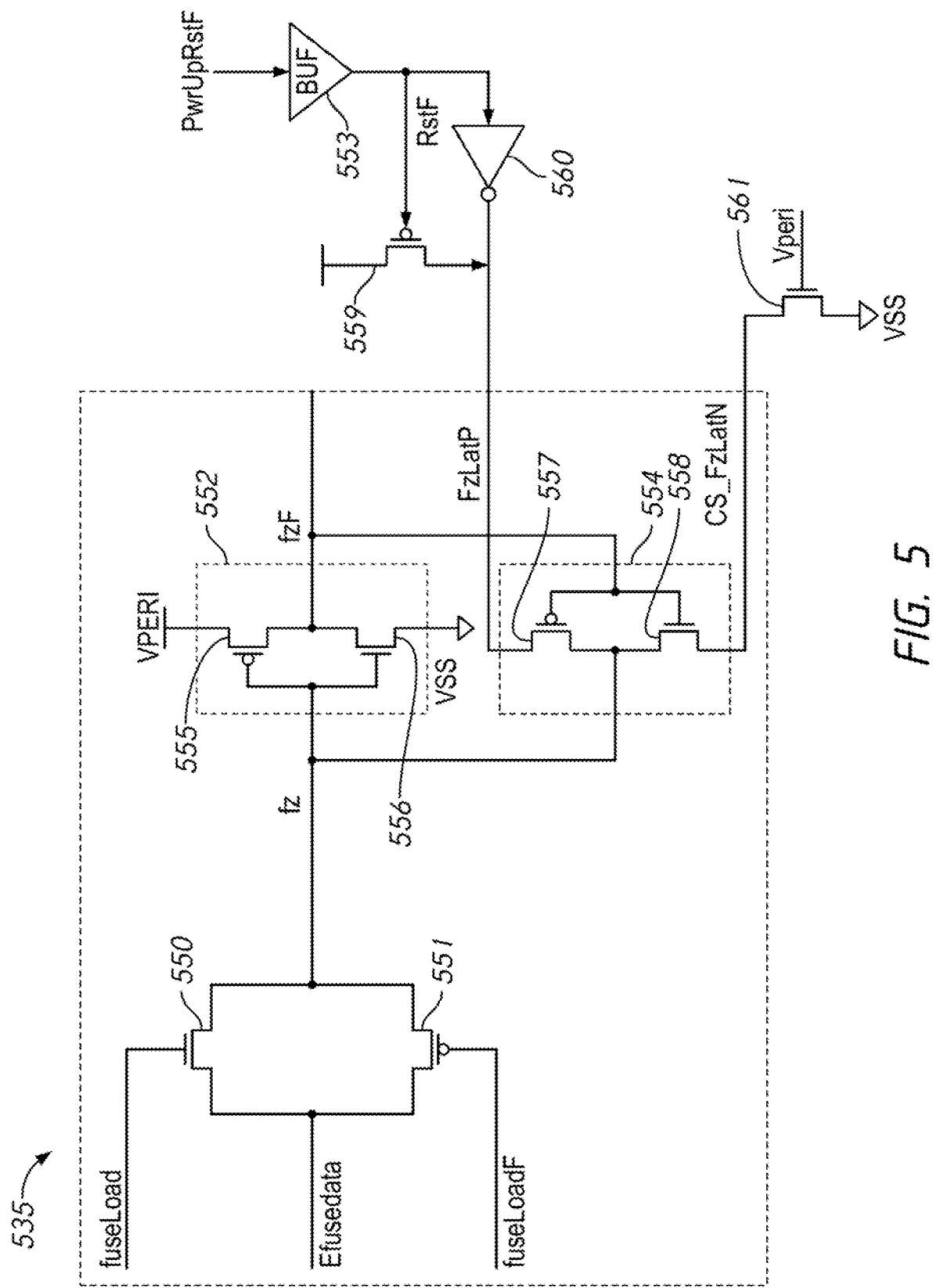
FIG. 5 is a schematic diagram of a latch circuit according to an embodiment of the present disclosure.

FIG. 5 is a schematic diagram of a latch circuit according to an embodiment of the present disclosure. FIG. 5 shows the latch circuit 435 of FIG. 4 along with additional circuits used during the initialization of the latch circuit 435. For the sake of brevity, operations and components described with respect to FIG. 4 will not be repeated in FIG. 5. Components of FIG. 5 which are shared in common with FIG. 4 reuse the same reference numbers.

The latch circuit 535 shows additional components, omitted from FIG. 4 for the sake of clarity, used to prevent the latch circuit 535 from falsely latching a positive value during a power up sequence. The latch circuit 535 may be 'floated' during a power up operation in order to prevent the latch circuit 535 from falsely latching a positive value. In some embodiments, this may reduce the reliance on, or even eliminate the need for, a separate switch (e.g., a transistor) used to reset the value stored in the latch circuit 535.

A driver circuit and a ninth transistor 561 are used to provide power to the high power terminal and the low power terminal, respectively, of the second inverter 454. As shown in the example embodiment of FIG. 5, the driver circuit includes buffer 553, inverter 560 and transistor 559. Other configurations of driver circuit are possible in other example embodiments. In some embodiments, the driver circuit and the ninth transistor 561 may be shared in common with all of the latch circuits 535 in a given fuse register (e.g., fuse register 319 of FIG. 3). In some embodiments, the driver circuit and ninth transistor 561 may be shared in common between all of the latch circuits 535 of all the fuse registers.

The ninth transistor 561 has a source coupled to a ground voltage (e.g., VSS), a drain coupled to the low power terminal of the second inverter 454 (e.g., the source of the sixth transistor 458), and a gate coupled to a system voltage (e.g., VPERI). The ninth transistor may be an n-type transistor. The system voltage coupled to the gate may generally keep the ninth transistor 561 activated, which may couple the low power terminal of the second inverter 454 to the ground voltage. In some embodiments, the ninth transistor 561 may be a p-type transistor and may be biased towards activation by a ground voltage (e.g., VSS), coupled to the gate.

As shown in the example embodiment of FIG. 5, the driver circuit includes a buffer circuit 553 with an input terminal coupled to the reset signal PwrUpRstF. When the signal PwrUpRstF is at a high level, the buffer 553 provides a signal RstF at a high level on a node coupled to an output terminal of the buffer circuit 553. The signal PwrUpRstF may generally be at a high logical level during a power up operation (e.g., a power up of a device, such as the device 100 of FIG. 1). Accordingly, during a power up operation, the signal RstF may also be provided at a high logical level. The buffer circuit 553 may be used to change one or more of a voltage, current, and timing of the signal RstF relative to the signal PwrUpRstF. In some embodiments, the buffer circuit 553 may be omitted and the signal PwrUpRstF may be used as the signal RstF directly.

The node carrying the signal RstF is coupled to the input terminal of an inverter circuit 560. The output of the inverter circuit 560 is coupled to a node carrying the signal FzLatP. The node carrying RstF is also coupled to the gate of a tenth transistor 559. The tenth transistor 559 also has a source coupled to a system voltage (e.g., VPERI or VDD) and a drain coupled to the node carrying FzLatP. The tenth transistor 559 may be a p-type transistor. When the signal RstF is at a high logical level, the inverter 560 may provide the signal FzLatP at a low logical level. When the signal RstF is at a low logical level, the tenth transistor 559 may couple the system voltage to the node carrying FzLatP (e.g., to the source of the transistor 557).

Accordingly, when the signal RstF is at a high level (e.g., during a rest operation), the signal FzLatP may be at a low level (e.g., a ground voltage) and when the signal RstF is at a low level, the signal FzLatP may be at a high level (e.g., a voltage such as VPERI or VSS). Since a ground voltage (e.g., VSS) may generally be used to represent a low logical level, accordingly during a power up operation both the high and low power terminals of the second inverter circuit 454 may generally be coupled to a ground voltage and the second inverter circuit 454 may therefore be floating since there is a connection to only one power level (e.g., ground). This may generally prevent the second inverter circuit 454 from providing a high logical level on the output terminal regardless of the state of the signal (e.g., fzF) coupled to the input terminal of the second inverter circuit 454. In other embodiments, it may which is floated during a power up operation, and the high power terminal which is coupled to a constant supply of the system voltage. In some embodiments, one or both of the high and the low power terminals may be disconnected from any voltage entirely during the power up operation. The timing of various signals during a reset operation is described in more detail in FIG. 9.

Figure 6:
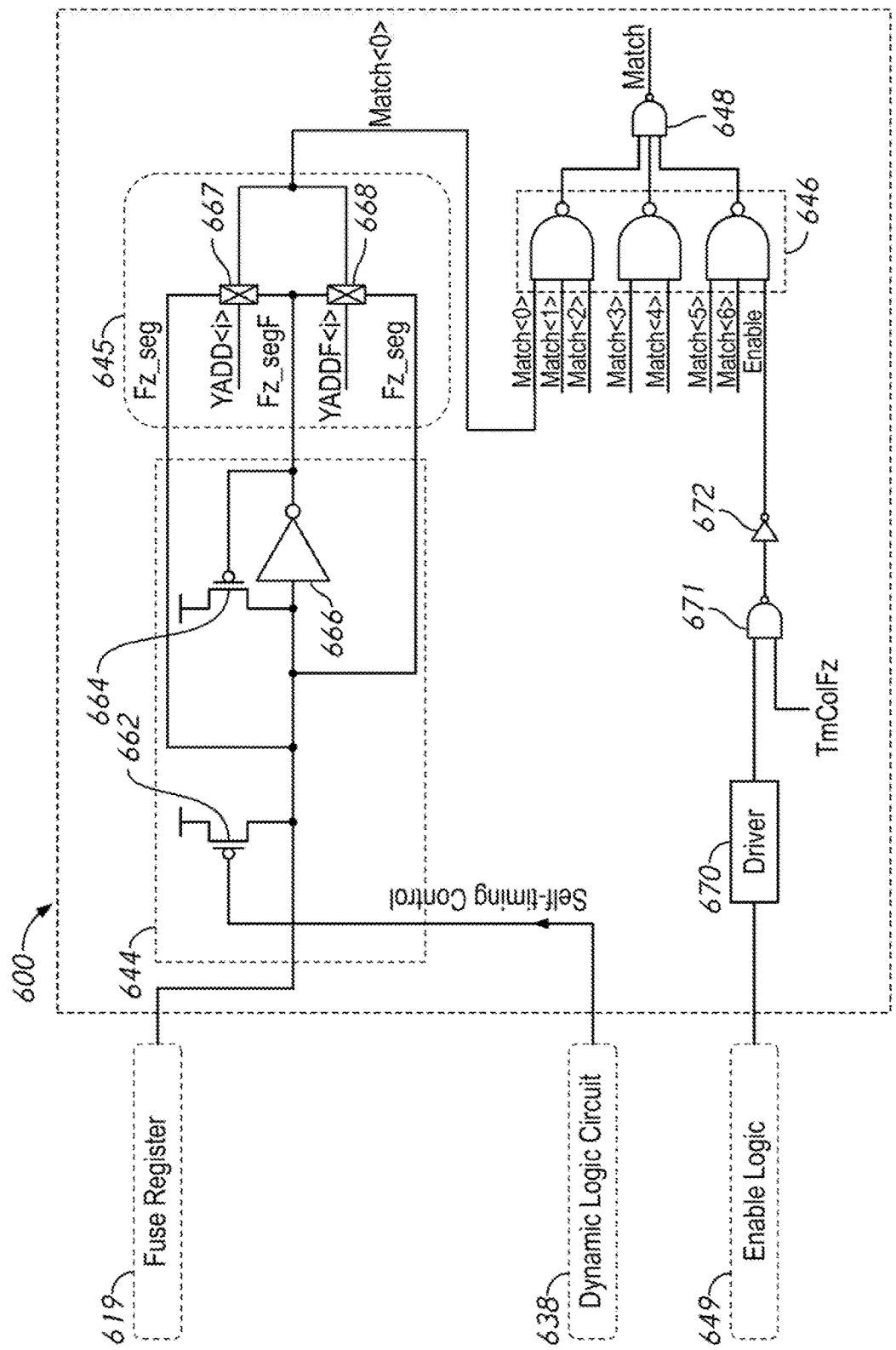
FIG. 6 shows a portion of a fuse match logic circuit according to an embodiment of the present disclosure.
Figure 7:
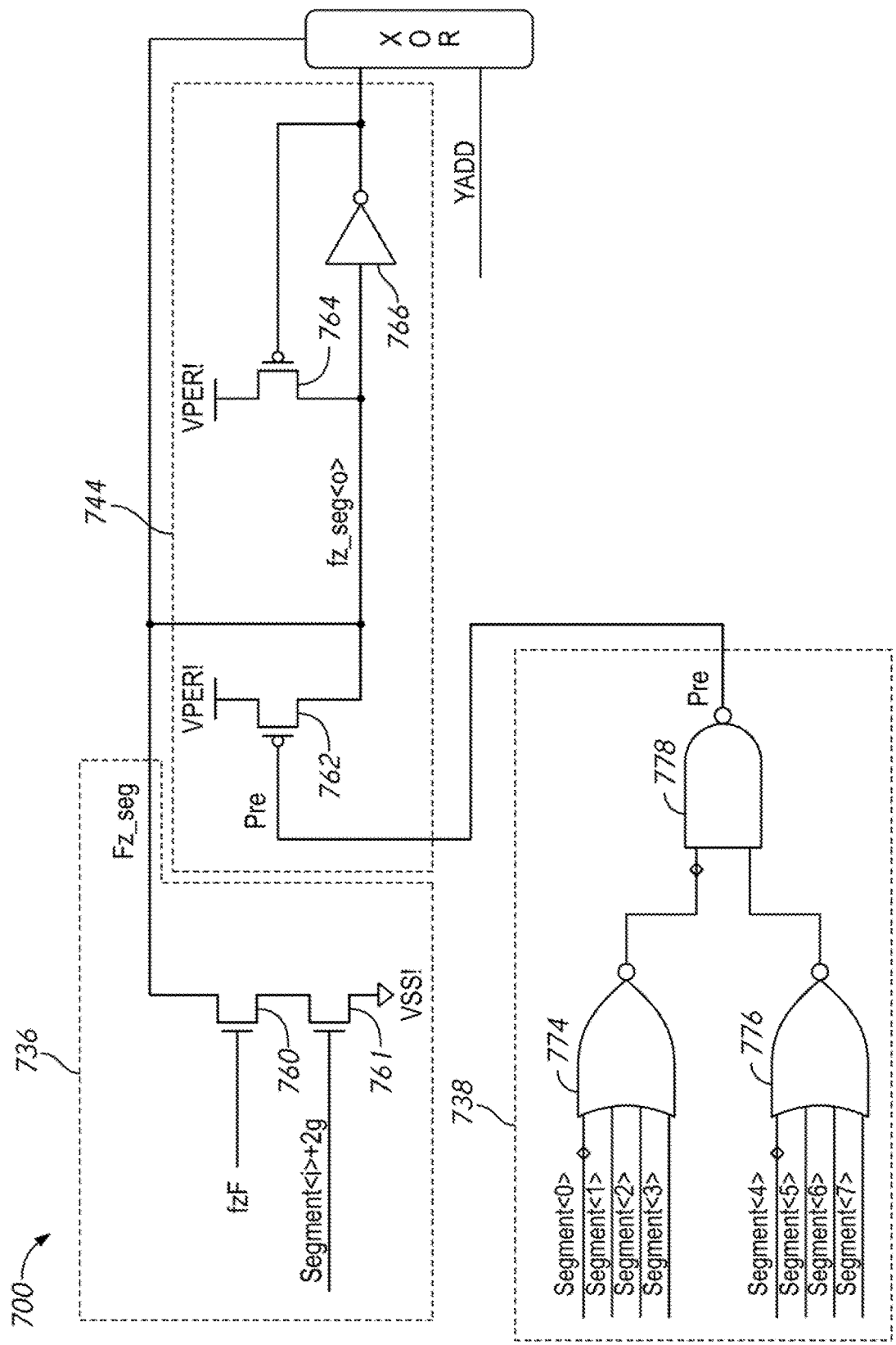
FIG. 7 is a schematic diagram of a portion of fuse match logic according to an embodiment of the present disclosure.
Figure 8:
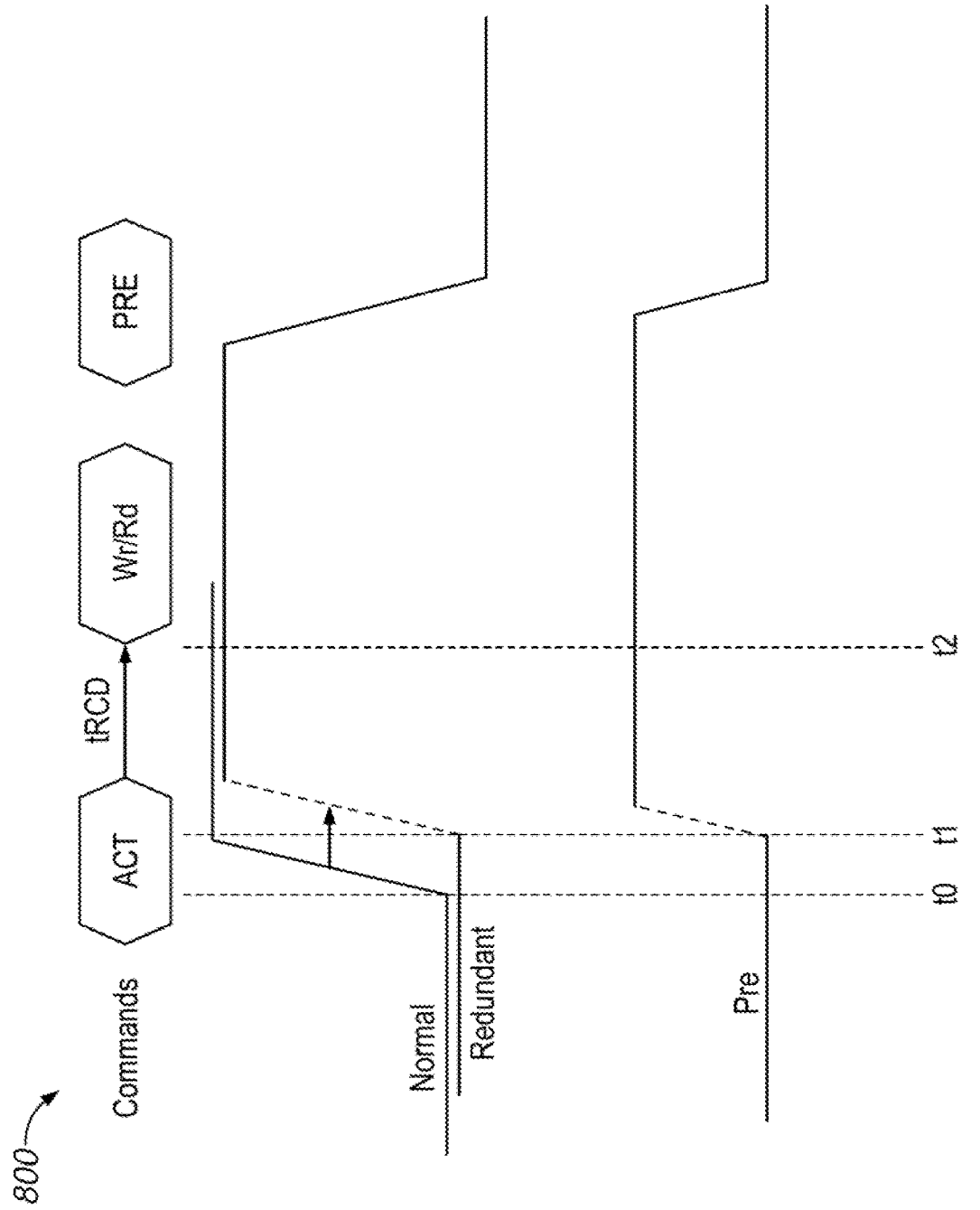
FIG. 8 is a timing diagram of signals involved in an access operation of a memory device according to an embodiment of the present disclosure.

FIGS. 6-8 show the components of a fuse match logic circuit and its operation in more detail.

FIG. 6 shows a portion of a fuse match logic circuit according to an embodiment of the present disclosure. The fuse match logic circuit 600 may, in some embodiments, may be included in the fuse match logic circuit 300 of FIG. 3. The fuse match logic circuit 600 shows a driver circuit 644 which may, in some embodiments, be included in the driver circuit 344 of FIG. 3 and the stages of the comparator circuit 645-648 which may, in some embodiments, be included in the comparator circuits 345-358 of FIG. 3. Other components such as a fuse registers 619, dynamic logic circuit 638 and enable logic 649 are also shown to provide context for the operation of the fuse match logic circuit 600.

The driver circuit 644 receives a signal Fz_seg from an activated one of the fuse registers 619 and provides the signal Fz_seg and the signal Fz_segF, which may be a logical compliment to the signal Fz_seg, to the first stage comparator 645. The driver circuit 644 may also be used to pre-charge the signal line carrying the signal Fz_seg. Although only a single fuse register 619 is shown, the driver circuit 644 may be coupled in common to the associated bit (e.g., one of the fuse latches 334 of FIG. 3) of each of the fuse registers 619. Similarly, for clarity the fuse match logic circuit 600 shows only a single driver circuit 644 and single first stage comparator 645. There may be a driver circuit 644 and first stage comparator 645 for each of the bits of the stored address (e.g., each of the fuse latches).

The driver circuit 644 includes a first transistor 662, a second transistor 664, and an inverter circuit 666. The first transistor 662 may be used to pre-charge the signal line carrying the signal Fz_seg. The first transistor 662 has a source coupled to a system voltage (e.g., VDD, VPERI), a drain coupled to the signal line carrying Fz_seg, and a gate coupled to the Self-timing Control signal provided by the dynamic logic circuit 638. The first transistor 662 may be a p-type transistor. The gate may be coupled to signal Pre, which is one of the Self-timing Control signals. The signal Pre and the operation and timing of the first transistor 662 is discussed in more detail in FIGS. 7-8. In brief, when none of the fuse registers 619 are active, the signal Pre may be at a low logical level, which may activate the first transistor 662. When the first transistor 662 is active, it may coupled the signal line carrying the signal Fz_seg to the system voltage, which may pre-charge the signal line to a voltage which represents a high logical level. When any of the fuse registers 619 is active (e.g., as indicated by the signal Segment), the signal Pre may be at a low logical level, which may inactivate the first transistor 662.

The driver circuit 644 includes an inverter circuit 666 with an input terminal coupled to the signal Fz_seg, and an output terminal which provides the signal Fz_segF, which is a logical compliment (e.g., the inverse of) the signal Fz_seg. The second transistor 664 has a source coupled to a system voltage (e.g., VDD, VPERI), a drain coupled to the signal Fz_seg, and a gate coupled to the signal Fz_segF. The second transistor 664 may act as feedback to reinforce the signal Fz_seg when the signal Fz_seg is at a high level. When the signal Fz_seg is at a high level, the inverter 666 may provide the signal Fz_segF at a low logical level, which in turn may activate the second transistor 664. When the second transistor 664 is active, it may couple the signal Fz_seg to the system voltage (e.g., VDD, VPERI) which represents a high logical level. Conversely, when the signal Fz_seg is at a low logical level, the signal Fz_segF may be at a high logical level, which in turn may inactivate the second transistor 664.

The driver circuit 644 provides the signals Fz_seg and Fz_segF to the first stage comparator 645. The first stage comparator 645 may also receive a bit of a memory line address. In the example embodiment of FIG. 6, the fuse register 619 stores a column address, and the first stage comparator 645 may receive a row address YADD. In particular, the first stage comparator 645 may receive a bit of the row address, here labelled YADD<i> which matches a bit of the column address stored in the fuse register 619 which has been provided as the signal Fz_seg.

The first stage comparator circuit 645 may act as an XOR logic gate, with an input coupled to Fz_segF and an input coupled to YADD<i>. Accordingly, if there is a match between Fz_segF and YADD<i> (e.g., the bit stored in the fuse latch does not match YADD<i>) then the first stage comparator 645 may provide a signal match<i> at a low level. If there is not a match between Fz_segF and YADD<i> (e.g., the bit stored in the fuse latch does match YADD<i>) then the signal match<i> may be provided at a high logical level. In some embodiments, the first stage comparator 645 may include a first pair of transistors 667 and a second pair of transistors 668 which work together to act as an XOR logic gate.

The second stage comparator 646 and the third stage comparator 648 work together to provide an overall signal Match, which is high only when all the bits of the address saved in the fuse register 619 match all the associated bits of the received address YADD (and when an enable signal is high). The second stage comparator circuit 646 receives the signals match<i> from all of the first stage comparators 645. In other words, the second stage comparator 646 may receive the signals match<i> for all values of i. The second stage comparator also receives a signal enable based on the enable logic 649. The signal enable may indicate if the redundant row associated with the fuse register 619 is enabled or not.

In some embodiments, the enable logic 649 may provide a signal to a driver circuit 670, which may adjust the current and/or voltage of the signal. In some embodiments, the enable logic 649 may represent an extra bit in each fuse register which stores an enable state of that fuse register. The signal from the driver 670 is provided to an NAND gate, which provides a signal at a low level when the signal from the enable logic 649 is at an active level and when a trim signal TmColFz is at a high level. The signal is then inverted by an inverter 672 to provide the signal enable. Accordingly, enable may be at a high level when both the signal from the enable logic 649 and the signal TmColFz are at a high level.

The second and third stage comparators 646-648 may both include a number of NAND logic gates which may work together to combine the signals enable and the signals match<i>. In the example embodiment of FIG. 6, there may be seven different bits stored in the fuse register 619 (e.g., YADD<3:9>). As shown, the second stage comparator 646 includes a first NAND gate with match<3:5> as inputs, a second NAND gate with match<6:7> as inputs, and a third NAND gate with match<8:9> and enable as inputs. The outputs of these three NAND gates are coupled to the inputs a fourth NAND gate in the third stage comparator 648, which provides the signal Match when all of match<3:9> and enable are at a high level. Other arrangements of logic gates and other types of logic gates and other types of logic gates in the second and third stage comparators 646-648 may be used in other embodiments.

FIG. 7 is a schematic diagram of a portion of fuse match logic according to an embodiment of the present disclosure. FIG. 7 shows portions of a fuse match logic 700, which may be useful for a discussion of the self-timing of a comparison operation performed by a fuse register and fuse match logic circuit. For example, FIG. 7 shows a selector circuit 736 (e.g., selector circuit 336 of FIG. 3), driver circuit 744 (e.g., driver circuit 344 of FIG. 3), a first stage comparator circuit 745 (e.g., first stage comparator 345 of FIG. 3) and a portion of a dynamic logic circuit 738 (e.g., dynamic logic circuit 338 of FIG. 3). Since the operations and components of the portions of the fuse match logic 700 are similar to those which have been previously described, for the sake of brevity those descriptions will not be repeated.

The portions of the fuse match logic 700 show how the signals which are used to control the pre-charge and comparison operation may be staggered relative to each other to achieve self-timing of the operations. When an activation command is received (e.g., the signal ACT), a memory line address may be provided to the dynamic logic circuit which may be decoded into a signal Segment<i>. A delay time after the signal Segment<i> is activated, the command signal Pre is activated to pre-charge the signal line which carries the signal Fz_seg. In some embodiments, this may prevent or reduce the chance of the pre-charging of the signal line Fz_seg from affecting the state of the bit stored in the latch and/or causing a confliction current. The delay time is represented by the labelling of the signal as Segment<i>+2g, where the +2g represents the delay time.

The dynamic logic 738 may provide the command signal Pre at a high logical level a delay time after one of the fuse registers (e.g., fuse register 319 of FIG. 3) becomes active. The dynamic logic 738 includes a first pair of NOR gates 776 and a NAND gate 778. The NOR gates may have inputs coupled to the individual segment signals Segment<i>. In the particular embodiment of FIG. 7, there are eight different fuse registers, and eight segment signals (e.g., Segment<0:7>). The first NOR gate may be coupled to the signals Segment<0:3> and the second NOR gate may be coupled to the signals Segment<4:7>. Accordingly, the pair of NOR gates 776 may return a first signal and a second signal, where at least one of the two signals is at a high level when any of the signals Segment<0:7> is at a high level (e.g., when at least one of the fuse registers is activated). The NAND gate 778 may provide the signal Pre at a low level only when both of the pair of NOR gates 776 are providing outputs at a high level and may provide Pre at a high level otherwise. Accordingly, the signal Pre may only be provided at a high level after any of the signals Segment<i> becomes active. Since there are two levels to the dynamic logic circuit 738 (e.g., the pair of NOR gates 776 and the NAND gate 778) between any given segment signal and the signal Pre, the signal Pre may be provided a delay time after the signal Segment rises to a high level. This delay time may be based on the number of sequential logic gates (e.g., in this case two sequential logic gates or "+2g") between any given signal Segment and the command signal Pre.

FIG. 8 is a timing diagram of signals involved in an access operation of a memory device according to an embodiment of the present disclosure. The timing diagram 800 shows signals of a device (e.g., device 100) which may be used to illustrate the self-timing of a fuse register and match circuit, such as those described in the previous Figures. Time may generally proceed from left to right in the timing diagram 800, while the logical state (e.g., as represented by a voltage) of signals is shown along the vertical access. Both axes may be arbitrary and not all waveforms are shown to scale with each other. The example waveforms of the timing diagram 800 are for illustrative purposes only, and other waveforms and relationships between waveforms may be used in other example embodiments.

The first line of the timing diagram shows commands of the memory. During an access command, an activation command ACT may be received at a first time. The activation command ACT may be accompanied by a row and column address, which in turn may cause a dynamic logic circuit (e.g., 338 of FIG. 3) to activate a segment signal. After a time designated as tRCD, read and/or write operations (Wr/Rd) may be performed. After the Wr/Rd operations are performed, and signal PRE (different from the signal Pre) may close the activated wordline. If a repair operation has been performed, it may be important to activate the redundant memory line before the Wr/Rd operations are performed.

The second and third waveforms of the timing diagram 800 represent the activation states of the normal memory line and redundant memory line. The normal memory line may be the row or column originally associated with the address which accompanies the ACT command, while the redundant memory line may be the memory line which that address has been assigned to as part of a repair operation. The fourth line of the timing diagram 800 represents the pre-charge signal Pre which is provided by the dynamic logic circuit to begin a comparison operation.

At an initial time t0, responsive to the address(es) which accompany the activation command ACT, the normal wordline associated with the address is activated. This may also cause the dynamic logic circuit to activate the segment signal Segment.

At a first time t1, which is a delay time after the initial time t0, the signal Pre may begin to transition to a high level. The delay time between t0 and t1 may be based on a number of logic gates the dynamic logic circuit uses to activate the signal Pre once any of the signals Segment is activated. For example, the time between t0 and t1 may represent the delay timing of two logic gates. After the time t1, when the signal Pre is high, the comparison operation may be performed, and the signal Match (not shown) may rise to a high level. This in turn, may cause the redundant memory line to activate. Since the time tRCD is relatively long compared to the delay between t0 and t1 (and the time it takes Match to activate), the redundant memory line may activate sometime between t1 and a second time t2, when read and/or write operations begin. Accordingly, the read and/or write operations may be performed on the redundant memory line rather than the normal memory line (which in this example is defective).

Figure 9:
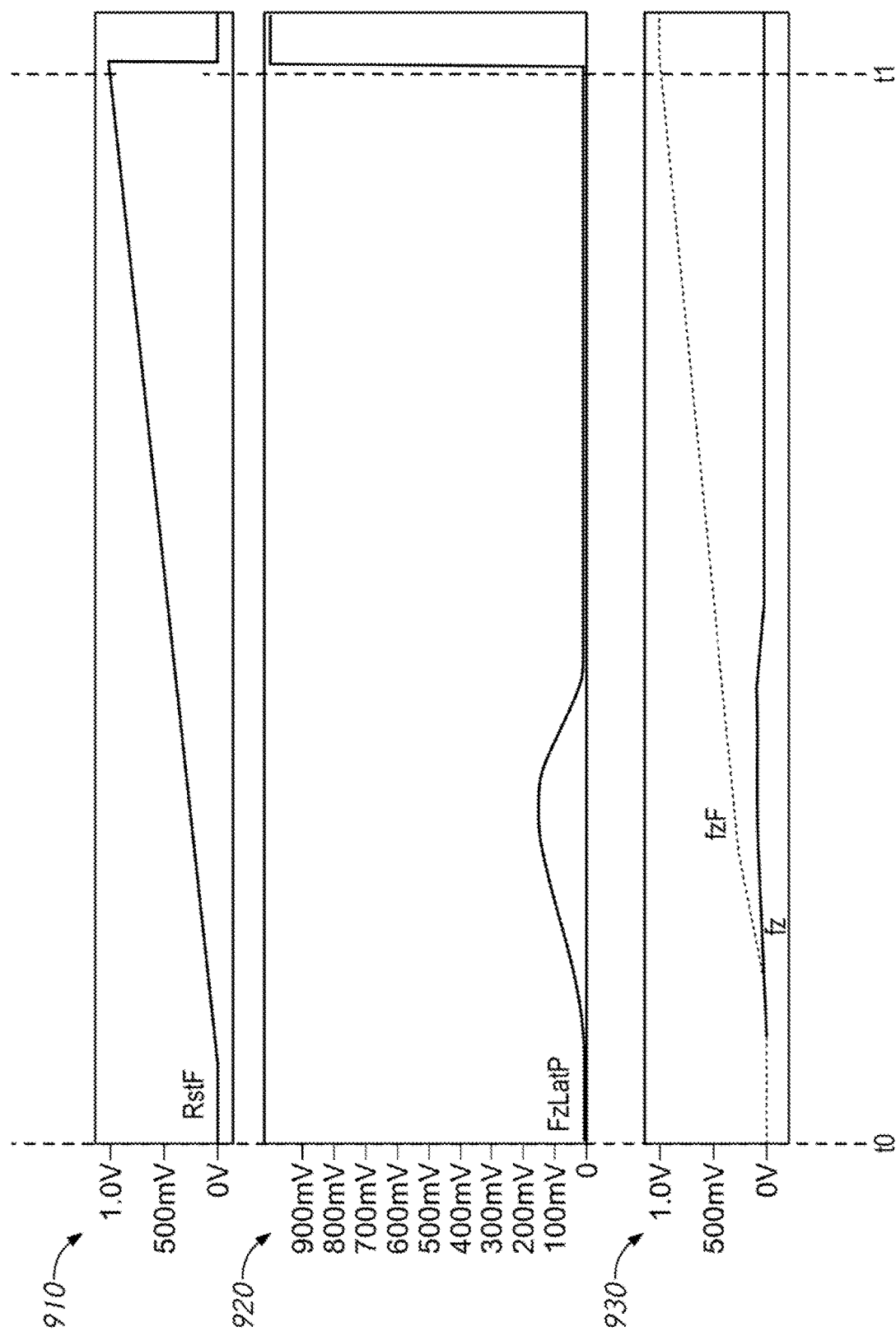
FIG. 9 is a graph of a signals during a reset operation according to an embodiment of the present disclosure.

FIG. 9 is a graph of a signals during a reset operation according to an embodiment of the present disclosure. The graphs 910-930 represent various signals which may be used by a fuse latch (e.g., 335 of FIG. 3, 435 of FIG. 4, and/or 535 of FIG. 5) during a power up procedure. The waveforms of FIG. 9 will generally be described with respect to the fuse latch 535 of FIG. 5, along with the other components described in that figure, however it should be understood that the concepts illustrated in the graphs 910-930 may apply to the other fuse latches described herein.

Each of the graphs 910-930 has a vertical axis which represents a voltage and a horizontal axis which represents time. The vertical axes of each of the graphs use 0V to represent a low logical level (e.g., the ground voltage VSS) and 1V to represent a high logical level (e.g., VPERI or VDD). It should be understood that the choice of voltage is for illustrative purposes only, and that any voltages may be used as high and low logical level. Similarly, although as shown in FIG. 9 each of the signals shown in FIG. 9 is on the same scale from 0V to 1V, in other embodiments, different signals may use different voltages from other signals.

The graph 910 shows the signal RstF (e.g., as provided by buffer circuit 553 of FIG. 5). At a time t0, a reset operation of the device (e.g., a power up) begins. The signal RstF may start at a low level at t0 and then increase over time until it reaches a high level at t1. The increase may be due to the system powering on, and the voltage supply of the device (e.g., voltage generator 124 of FIG. 1) taking time to provide system voltages such as VPERI at a high level. In some embodiments, the increase in RstF may mimic the increase in a system voltage such as VPERI. After the time t0, when the reset operation has finished, the signal RstF may drop to a low logical level (e.g., about 0V).

The graph 920 shows the signal FzLatP. At the time t0 when the reset operation begins, the signal FzLatP may be a low logical level (e.g., 0V). As the system powers up, the signal FzLatP may fluctuate over time (e.g., due to imperfections in one or more of the physical components of the system). However, the voltage of FzLatP may stay below a voltage necessary to power the fuse latch (e.g., to power the inverter 545 of FIG. 5). As the system continues to power up, the inverter 560 may be able to hold the voltage of FzLatP at 0V. Accordingly, the fuse latches coupled to FzLatP may remain floating between t0 and t1 (e.g., the reset operation). When the signal RstF changes to a low level after t1, the signal FzLatP may change to a high level, and the inverter may no longer be floating.

The graph 930 shows the signals fz and fzF stored in the fuse latch. Since the graphs 910-930 represent a reset operation, the value of the bit stored in the latch should remain at a low logical level, and therefore the signal fz should be at a low logical level and the signal fzF should be at a high logical level. As may be seen, the signal fzF increases over time as the system powers up (e.g., due to the increasing level of the system voltages provided by the voltage generator). The signal fz may fluctuate slightly due to the fluctuations of the signal FzLatP, but since the inverter of the fuse latch remains floating, the signal fz remains at a low logical level.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
    a plurality of fuse registers each configured to store a memory address;
    a dynamic logic circuit configured to activate one of the plurality of fuse registers based on an access operation; and
    a match logic circuit configured to compare the address stored in the activated one of the plurality of fuse registers to a received address and selectively activate a redundant group of memory cells based on the comparison,
    wherein based on the access operation the dynamic logic circuit is configured to control a timing of the comparison performed by the comparator circuit.

2. The apparatus of claim 1, further comprising a memory array comprising a plurality of segments, wherein each of the plurality of fuse registers is associated with one of the plurality of segments.

3. The apparatus of claim 1, wherein each of the plurality of fuse registers comprises a plurality of latch circuits each configured to store a bit of the memory address, wherein the latch circuit comprises a strong inverter circuit and a weak inverter circuit, and wherein the weak inverter circuit is floated during a power up operation of the apparatus.

4. The apparatus of claim 1, wherein the plurality of fuse registers are each configured to store a column address, and wherein the match logic circuit selectively activates a redundant column.

5. The apparatus of claim 1, further comprising:
    a plurality of signal lines coupling the plurality of fuse registers to the match logic circuit;
    a plurality of driver circuits each configured to pre-charge one of the plurality of signal lines to a first voltage responsive to a command signal from the dynamic logic circuit; and
    a plurality of selector circuits configured to change a voltage of an associated one of the plurality of signal lines responsive to a select signal from the dynamic logic circuit based on the state of a bit of the memory address stored in the associated one of the plurality of fuse registers.

6. The apparatus of claim 5, wherein the dynamic logic circuit is configured to provide the command signal at a first time and provide the select signal at a second time which is after the first time.

7. The apparatus of claim 6, wherein the time between the first time and the second time is based on a number of sequential logic gates that the dynamic logic circuit uses to provide the command signal responsive to the select signal.

8. The apparatus of claim 1, wherein the dynamic logic circuit is configured to inactivate the others of the plurality of fuse registers based on the access operation.

9. An apparatus comprising:
    a plurality of latch circuits, each configured to store a bit of a stored row address, wherein the plurality of latch circuits each include a power supply terminal coupled in common to a driver circuit configured to float the power supply terminal during a power up operation of the apparatus; and
    a match logic circuit configured to compare the bits of the stored row address to a received row address and activate a redundant memory line of a memory array associated with the plurality of latch circuits when there is a match between the stored row address and the received row address.

10. The apparatus of claim 9, further comprising a fuse array configured to provide the stored row address to the plurality of latch circuits.

11. The apparatus of claim 9, wherein the match logic circuit further comprises:
    a plurality of first stage comparator circuit configured to compare each bit of the stored row address to an associated bit of the received row address and provide one of a plurality of bit match signals at a high logical level when there is a match;
    a second stage comparator circuit configured to provide a first intermediate match signal at a high logical level when a first portion of the plurality of bit match signals are all at a high logical level and provide a second intermediate match signal at a high logical level when a second portion of the plurality of bit match signals are all at a high logical level; and
    a third stage comparator circuit configured to provide an overall match signal when both the first and the second intermediate match signals are at a high level.

12. The apparatus of claim 11, wherein the second stage comparator circuit is further configured to provide the second intermediate match signal at a high logical level when the second portion of the plurality of bit match signals are all at a high logical level and an enable signal is active.

13. The apparatus of claim 11, wherein the redundant memory line is activated responsive to the overall match signal.

14. The apparatus of claim 9, further comprising:
a plurality of signal lines each coupling one of the plurality of latch circuits to the match logic circuit;
a plurality of driver circuits configured to pre-charge each of the plurality of signal lines responsive to a command signal to a first logic level; and
a plurality of selector circuits, each associated with one of the latch circuits and one of the plurality of signal lines, wherein each of the plurality of selector circuits is configured to change a state of the signal line from the first logic level to a second logic level based on the state of the bit stored in the associated one of the plurality of latch circuits responsive to a select signal.

15. The apparatus of claim 14, further comprising a dynamic logic circuit configured to provide the command signal at a first time and the select signal at a second time after the first time.

16. An apparatus comprising:
a plurality of the fuse latch circuits each configured to store a bit of a memory address and comprising:
a first inverter circuit including a first input terminal, a first output terminal, a first high power supply terminal coupled to a system voltage, and a first low power supply terminal coupled to a ground voltage; and
a second inverter circuit including a second output terminal coupled to the first input terminal, a second input terminal coupled to the first output terminal, a second high power supply terminal and a second low power supply terminal, wherein at least one of the second high power terminal or the second low power terminal is floated during a power up operation of the apparatus,
wherein the second high power terminal of each of the plurality of fuse latch circuits is coupled in common to a driver configured to provide the ground voltage to each of the second high power terminals during the power up operation and configured to provide the system voltage otherwise.

17. The apparatus of claim 16, wherein the driver comprises an inverter circuit with an input coupled to an inverse power up signal which is at a low logical level during the power up operation and a high logical level otherwise.

18. An apparatus comprising:
a fuse latch circuit configured to store a bit of a memory address, the fuse latch circuit comprising:
a first inverter circuit including a first input terminal, a first output terminal, a first high power supply terminal coupled to a system voltage, and a first low power supply terminal coupled to a ground voltage; and
a second inverter circuit including a second output terminal coupled to the first input terminal, a second input terminal coupled to the first output terminal, a second high power supply terminal and a second low power supply terminal, wherein at least one of the second high power terminal or the second low power terminal is floated during a power up operation of the apparatus;
a dynamic logic circuit configured to provide a command signal; and
a selector circuit configured to change a state of a signal from a high logical state to a low logical state when the command signal is active and the signal provided by the first output terminal is at a low logical level.

19. An apparatus comprising:
a fuse latch circuit configured to store a bit of a memory address, the fuse latch circuit comprising:
a first inverter circuit including a first input terminal, a first output terminal, a first high power supply terminal coupled to a system voltage, and a first low power supply terminal coupled to a ground voltage; and
a second inverter circuit including a second output terminal coupled to the first input terminal, a second input terminal coupled to the first output terminal, a second high power supply terminal and a second low power supply terminal, wherein at least one of the second high power terminal or the second low power terminal is floated during a power up operation of the apparatus,
wherein the second inverter is weaker than the first inverter.

20. An apparatus comprising:
a fuse latch circuit configured to store a bit of a memory address, the fuse latch circuit comprising:
a first inverter circuit including a first input terminal, a first output terminal, a first high power supply terminal coupled to a system voltage, and a first low power supply terminal coupled to a ground voltage; and
a second inverter circuit including a second output terminal coupled to the first input terminal, a second input terminal coupled to the first output terminal, a second high power supply terminal and a second low power supply terminal, wherein at least one of the second high power terminal or the second low power terminal is floated during a power up operation of the apparatus; and
first transistor and a second transistor configured to act as switches to write a new bit to the first input terminal responsive to a write signal.

* * * * *